(12) United States Patent
Jacobs et al.

(10) Patent No.: US 8,462,313 B2
(45) Date of Patent: Jun. 11, 2013

(54) LITHOGRAPHIC APPARATUS AND DEVICE MANUFACTURING METHOD

(75) Inventors: Johannes Henricus Wilhelmus Jacobs, Heeze (NL); Hans Jansen, Eindhoven (NL); Jeroen Peter Johannes Bruijstens, Eindhoven (NL); Ivo Adam Johannes Thomas, Son (NL); Gerardus Adrianus Antonius Maria Kusters, Eindhoven (NL); Marcio Alexandre Cano Miranda, Eindhoven (NL); Gheorghe Tanasa, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 319 days.

(21) Appl. No.: 12/818,724

(22) Filed: Jun. 18, 2010

(65) Prior Publication Data

US 2011/0007287 A1 Jan. 13, 2011

Related U.S. Application Data (60) Provisional application No. 61/218,729, filed on Jun. 19, 2009.

(51) Int. Cl.
*G03B 27/42* (2006.01)
*G03B 27/52* (2006.01)

(52) U.S. Cl.
USPC .................................... 355/53; 355/30

(58) Field of Classification Search
USPC .................. 355/30, 53, 72; 250/548
See application file for complete search history.

(56) References Cited

U.S. PATENT DOCUMENTS

| 4,509,852 | A | 4/1985 | Tabarelli et al. ................. 355/30 |
|---|---|---|---|
| 7,411,658 | B2 * | 8/2008 | Beckers et al. .................. 355/72 |
| 7,841,352 | B2 | 11/2010 | Jansen et al. |
| 7,852,456 | B2 * | 12/2010 | Nagasaka ....................... 355/30 |
| 7,898,642 | B2 | 3/2011 | Kolesnychenko et al. |
| 8,212,991 | B2 * | 7/2012 | Dodoc et al. .................... 355/53 |
| 2004/0136494 | A1 | 7/2004 | Lof et al. ......................... 378/34 |
| 2004/0207824 | A1 | 10/2004 | Lof et al. ......................... 355/30 |
| 2005/0231694 | A1 | 10/2005 | Kolesnychenko et al. |
| 2006/0038968 | A1 | 2/2006 | Kemper et al. ................. 355/18 |
| 2006/0119809 | A1 | 6/2006 | Verhagen et al. ............... 355/30 |
| 2006/0158627 | A1 | 7/2006 | Kemper et al. ................. 355/53 |
| 2007/0081140 | A1 | 4/2007 | Beckers et al. |
| 2008/0212046 | A1 | 9/2008 | Riepen et al. ................... 355/30 |
| 2008/0271750 | A1 | 11/2008 | Jansen et al. |
| 2009/0296065 | A1 | 12/2009 | Cloin et al. ...................... 355/71 |

FOREIGN PATENT DOCUMENTS

| EP | A 1 420 298 | 5/2004 |
|---|---|---|
| EP | A 1 420 300 | 5/2004 |
| JP | 2005-303316 | 10/2005 |
| JP | 2007-110109 | 4/2007 |
| JP | 2008-124283 | 5/2008 |
| JP | 2008-294439 | 12/2008 |
| WO | WO 99/49504 | 9/1999 |
| WO | WO 2005/064405 | 7/2005 |

OTHER PUBLICATIONS

Japanese Office Action mailed Mar. 16, 2012 in corresponding Japanese Patent Application No. 2010-137799.

* cited by examiner

*Primary Examiner* — Hung Henry Nguyen
(74) *Attorney, Agent, or Firm* — Pillsbury Winthrop Shaw Pittman LLP (57) ABSTRACT

An immersion lithographic apparatus comprising a surface which is curved such that a surface-tension drainage force acts in a direction on a film of immersion liquid on the surface.

23 Claims, 6 Drawing Sheets

Fig. 1

-- PRIOR ART --

Fig. 2

-- PRIOR ART --

Fig. 3

-- PRIOR ART --

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/218,729, entitled "Lithographic Apparatus and Device Manufacturing Method", filed on Jun. 19, 2009. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desired. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic, a fluorohydrocarbon, or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system.

Another arrangement is an all wet arrangement in which the immersion liquid is unconfined as disclosed in PCT patent application publication no. WO2005/064405. In such a system the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

In EP-A-1,420,300 and US patent application publication number US 2004-0136494, each hereby incorporated in their entirety by reference, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

After exposure of a substrate in an immersion lithographic apparatus, the substrate table is moved away from its exposure position to a position in which the substrate may be removed and replaced by a different substrate. This is known as substrate swap. In a two stage lithographic apparatus, the swap of the tables may take place under the projection system.

In an immersion apparatus, immersion liquid is handled by a fluid handling system or apparatus. A fluid handling system may supply immersion fluid and therefore be a fluid supply system. A fluid handling system may at least partly confine fluid and thereby be a fluid confinement system. A fluid handling system may provide a barrier to fluid and thereby be a barrier member. Such a barrier member may be a fluid confinement structure. A fluid handling system may create or use a flow of fluid (such as gas), for example to help in handling liquid, e.g. in controlling the flow and/or the position of the immersion fluid. The flow of gas may form a seal to confine the immersion fluid so the fluid handling structure may be referred to as a seal member; such a seal member may be a fluid confinement structure. Immersion liquid may be used as the immersion fluid. In that case, the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid.

SUMMARY

In an immersion lithographic apparatus, control of the position of liquid is important. The space which is occupied by liquid in the apparatus is not constant with time. This can lead to undesirable effects such as: varying cooling rates (e.g., varying evaporational cooling rates), varying flow rates, vibrations, loss of liquid, etc. One or more of these is undesirable as it can lead to imaging errors. Maintaining the position of liquid constant as far as possible is therefore desirable. For example when the height of immersion liquid in the immersion space changes (for example due to movement of the substrate under the projection system), the level of immersion liquid against the side of the final optical element of the projection system can change. If the level falls, a film of liquid can be left behind on the side of the projection system. This can undesirably apply a heat load to the final optical element of the projection system. In another example, an opening or a passageway of an extractor may become at least partially blocked with liquid. This may undesirably result in an uneven extraction flow, for example. In another instance, liquid may collect in an undesirable location which could lead to loss of liquid in the immersion apparatus.

It is desirable, for example, to provide a surface which helps in controlling the position of immersion liquid in an immersion lithographic apparatus.

According to an aspect, there is provided an immersion lithographic apparatus comprising a surface which is curved such that a surface-tension drainage force acts in a direction on a film of immersion liquid on the surface.

According to an aspect, there is provided a liquid confinement structure constructed and arranged to confine liquid to an immersion space between a final element of a projection system and a substrate table and/or a substrate supported by the substrate table, the liquid confinement structure comprising a curved surface which is curved such that a surface-tension drainage force acts in a direction on a film of immersion liquid on the surface.

According to an aspect, there is provided a final element of a projection system for an immersion lithographic apparatus, the final element comprising a curved surface which is curved such that a surface-tension drainage force acts in a direction on a film of immersion liquid on the surface.

According to an aspect, there is provided a substrate table configured to support a substrate in an immersion lithographic apparatus, the substrate table comprising a curved surface which is curved such that a surface-tension drainage force acts in a direction on a film of immersion liquid on the surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
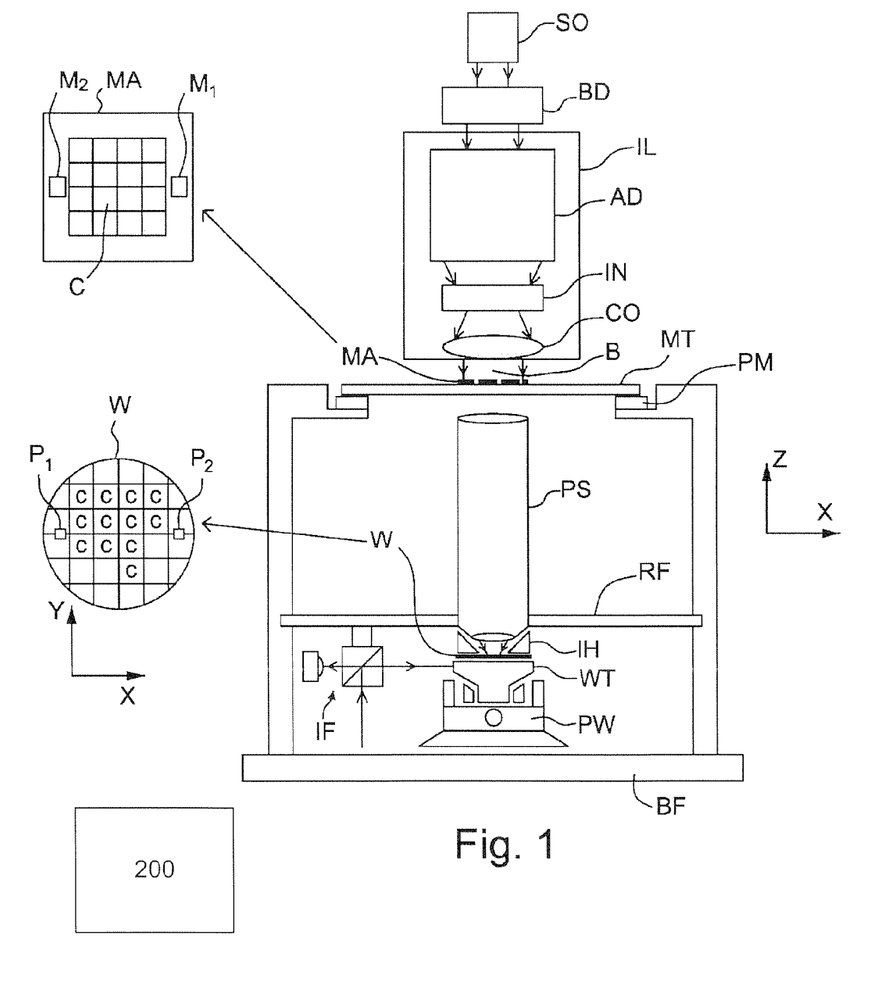
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as n-outer and n-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device MT and the substrate table WT are scanned synchronously while a pattern imparted to the radiation beam is projected onto a target portion C (i.e. a single dynamic exposure). The velocity and direction of the substrate table WT relative to the patterning device MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-5 show different supply devices which can be used in such a system. A sealing feature is present to seal liquid to the localized area. One way which has been proposed to arrange for this is disclosed in PCT patent application publication no. WO 99/49504.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
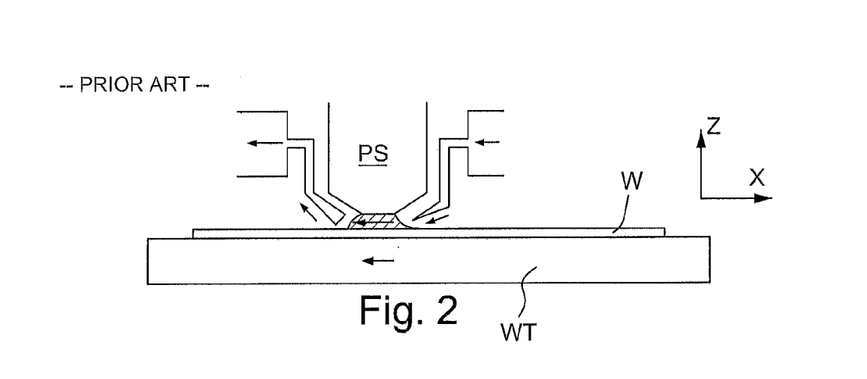
FIGS. 2 and 3 depict a liquid supply system for use in a lithographic projection apparatus.
Figure 3:
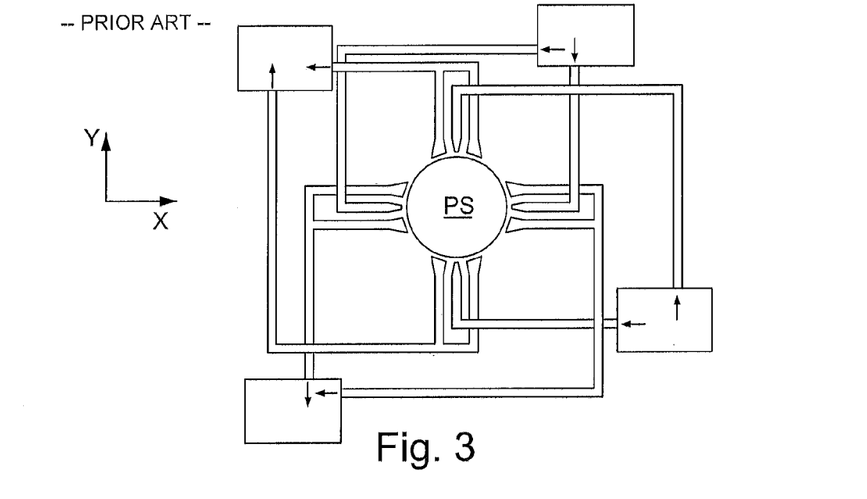

As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
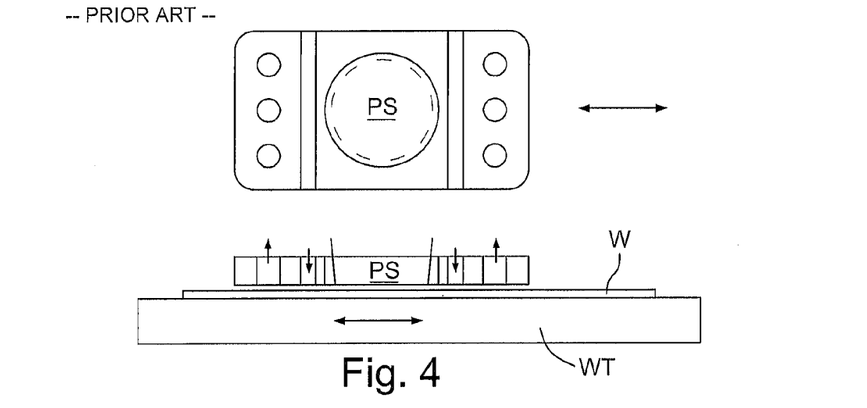
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
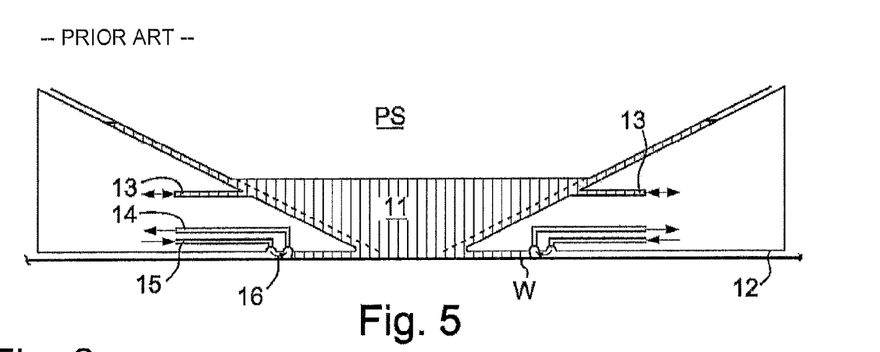
FIG. 5 depicts a further liquid supply system for se in a lithographic projection apparatus.

FIG. 5 schematically depicts a localized liquid supply system or fluid handling structure with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure and the surface of the substrate W and may be a contactless seal such as a gas seal (such a system with a gas seal is disclosed in European patent application publication no. EP-A-1,420,298) or liquid seal.

The liquid confinement structure 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the liquid confinement structure 12 positioned below and surrounding the final element of the projection system PL. Liquid is brought into the space below the projection system and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas. The gas in the gas seal is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

Figure 6:
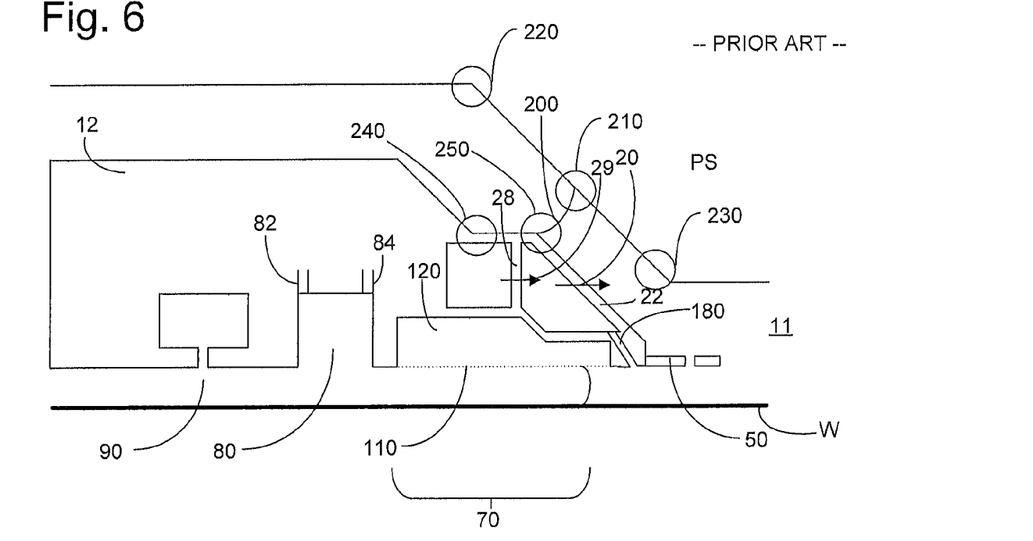
FIG. 6 depicts, in cross-section, a liquid confinement structure and a final element of a projection system according to an embodiment of the invention.

FIG. 6 illustrates a liquid confinement structure 12 which is part of a liquid supply system. The liquid confinement structure 12 extends around the periphery (e.g., circumference) of the final element of the projection system PS.

A plurality of openings 20 in the surface which defines the space 11 provide the liquid to the space 11. The liquid passes through openings 29, 20 in side walls 28, 22 respectively prior to entering the space 11.

A seal is provided between the bottom of the liquid confinement structure 12 and the substrate W. In FIG. 6 a seal device is configured to provide a contactless seal and is made up of several components. Radially outwardly from the optical axis of the projection system PS, there is provided a (optional) flow control plate 50 which extends into the space 11. Radially outwardly of the flow control plate 50 on the bottom surface of the liquid confinement structure 12 facing the substrate W or substrate table WT may be an opening 180. The opening 180 can provide liquid in a direction towards the substrate W. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid confinement structure 12 and the substrate W and/or the substrate table WT. The extractor assembly 70 may operate as a single phase or as a dual phase extractor.

Radially outwardly of the extractor assembly 70 may be a recess 80. The recess 80 is connected through an inlet 82 to the atmosphere. The recess 80 may be connected via an outlet 84 to a low pressure source. Radially outwardly of the recess 80 may be a gas knife 90. An arrangement of the extractor assembly, recess and gas knife is disclosed in detail in United States patent application publication no. US 2006/0158627 incorporated herein in its entirety by reference.

The extractor assembly 70 comprises a liquid removal device or extractor or inlet such as the one disclosed in United States patent application publication no. US 2006-0038968, incorporated herein in its entirety by reference. In an embodiment, the liquid removal device 70 comprises an inlet which is covered in a porous material 110 which is used to separate liquid from gas to enable single-liquid phase liquid extraction. An under pressure in chamber 120 is chosen is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70.

The porous material 110 has a large number of small holes each with a dimension, e.g. a width, such as a diameter, in the range of 5 to 50 μm. The porous material 110 may be maintained at a height in the range of 50 to 300 μm above a surface from which liquid is to be removed, e.g. the surface of a substrate W. In an embodiment, porous material 110 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. One way of dealing with this liquid is to provide a liquidphobic (e.g., hydrophobic) coating. The coating may form a band around the top of the liquid confinement structure 12 surrounding the opening and/or around the last optical element of the projection system PS. The coating may be radially outward of the optical axis of the projection system PS. The liquidphobic (e.g., hydrophobic) coating helps keep the immersion liquid in the space 11.

The examples of FIGS. 5 and 6 are a so called localized area arrangement in which liquid is only provided to a localized area of the top surface of the substrate W at any one time. Other arrangements are possible, including fluid handling systems which make use of a gas drag principle. The so-called gas drag principle has been described, for example, in United States patent application publication no. US 2008-0212046 and U.S. patent application no. U.S. 61/071,621 filed on 8 May 2008. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application no. U.S. 61/136,380 filed on 2 Sep. 2008.

As will be appreciated, any of the above described features can be used with any other feature and it is not only those combinations explicitly described which are covered in this application.

An embodiment of the invention makes use of a curved surface. The curve of the surface is such that a surface-tension drainage force acts on a film of liquid on the surface. The surface-tension drainage force can act in any direction, not just in the direction that gravity acts (e.g. in a direction against gravity). The curve of the surface is selected so that the surface-tension drainage force acts in a particular direction (e.g. a first direction). The direction is chosen such that the surface-tension drainage three acts on the liquid in a desired direction. The direction may have vertical and/or horizontal components. The curved surface can be used to generate a surface-tension drainage force to help drain a surface or to help keep a surface wet (e.g. maintain a film of liquid on a particular surface). The term surface-tension drainage force is the term used in the art, but in an embodiment of the invention the force does not necessarily act to "drain" liquid, as described above.

Surface-tension drainage force has been investigated in connection with condensing fins of condensers in which the surface-tension drainage force is used to move liquid from the tips of fins in a direction perpendicular to the force of gravity into the valley between fins. Once the liquid reaches the valley between fins gravity then acts on the liquid to remove it downwards. In this way a thin film of liquid which has condensed on the tips of fins can be moved off the tips of fins so that further liquid may condense on the films. See, e.g., the book "Heat Transfer Handbook" by Adrian Bejan and Allan D. Kraus published by John Wiley & Sons, 11 Jul. 2003.

Chapter 10 of the "Heat Transfer Handbook" describes surface-tension drainage force. In summary, if a liquid-vapor interface is curved, a pressure difference across the interface must be present to establish mechanical equilibrium of the interface. A large difference in pressure between the liquid and vapor occurs if the liquid has a large surface tension and the surface a small radius of curvature. A basic curved shape which can induce surface-tension drainage force is a curve whose local radius of curvature decreases in a first direction. This would result in a surface-tension drainage force acting on a film of liquid on the surface in the first direction.

Adamek defined (in Adamek, T., 1981, "Bestimmung der Kondensationgroessen auf feingewellten Oberflaechen zur Auslegung optimaler Wandprofile," Waerme-und Stoffueber­tragung, Vol. 15, pp 255-270) a series of curves in which the surface-tension on drainage force is particularly high. The equation of the curves is $$\kappa = \frac{\theta_m}{S_m}\left(\frac{\xi+1}{\xi}\right)\left[1 - \left(\frac{s}{S_m}\right)^\xi\right] \text{ for } -1 \le \xi \le \infty$$

in which $\kappa$ is the curvature of the liquid-vapor interface, $\theta_m$ is the maximum angle through which the condensate surface turns, $S_m$ is the maximum arc length, $\xi$ is a shape factor and s is the distance along the liquid-vapor interface.

For the simple case that there is only liquid film drainage without condensation onto this liquid film, the liquid film flow through each cross-section is constant. To maximize draining, the liquid film thickness is constant at each cross-section, which implies that the pressure gradient is constant. As the pressure gradient is linear with the gradient of the liquid film curvature and the liquid film thickness is constant, the wall profile in one embodiment may have a linearly decreasing curvature from start to end. Whenever there is condensation onto the liquid film while draining, the flow increases from start to end, which requires a slightly different wall profile for optimal drainage. A detailed calculation may be performed to exactly determine the wall profile. The pressure gradient has to increase towards the end to compensate for the higher flow.

Curves with an Adamek profile are desired because they are particularly efficient at applying a large surface-tension drainage force thereby maximizing liquid drainage and mini­mizing liquid film layer thickness. The so called Adamek profiles are optimized for drainage, meaning for minimum thickness.

Figure 7:
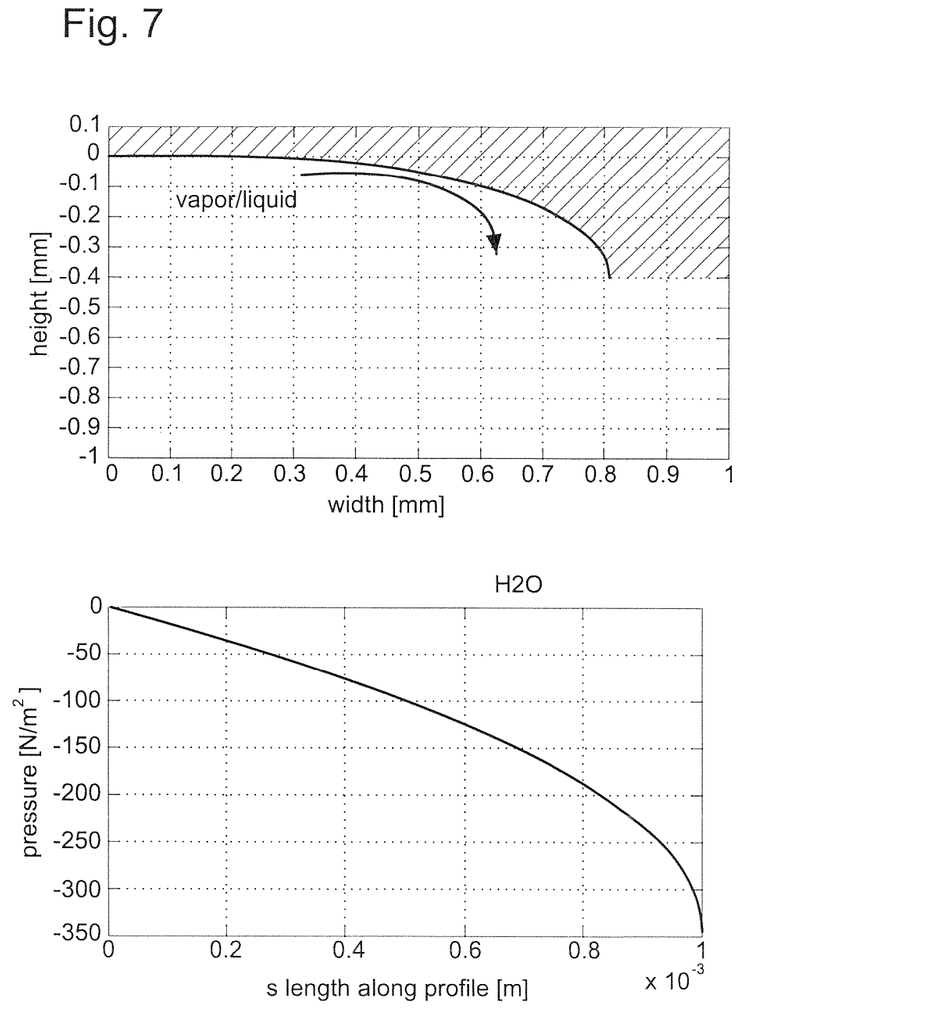
FIG. 7 depicts the principle of how a curved surface applies surface-tension drainage forces on a film of liquid.

In FIG. 7 the left hand graph shows a curved surface of a material (the material is on the right hand side) which has an Adamek shape with a shape factor $\xi$ of –0.5. In this case a film of liquid adhered to the surface on the left hand side of the material would have a force on it along the surface down­wards, as illustrated. The right hand graph shows the pressure profile which would be present in the liquid of the film of liquid on the surface. As can be seen, the negative pressure increases along the length of the surface and this results in the surface-tension drainage force which acts on the liquid in the film downwards as illustrated. These forces are additional to gravity and any other forces which might be acting on the film (e.g. shear due to viscous forces in the film to be drained or to a lesser extent due to a flow of gas). A changing curvature of a concave surface causes a liquid film to flow in the direction of decreasing radius, due to the liquid's surface tension. The same occurs for convex shapes but here the flow will be in the reverse direction.

An embodiment of the invention makes use of both positive and negative curves (concave and convex), dependent upon in which direction the surface-tension drainage force is to act.

In an embodiment the geometry of a first surface is such that the surface-tension drainage force acts in such a direction that the surface-tension drainage force acts together with the force of gravity on liquid in the film to move the liquid in the film in a first direction. For example, the first direction could be a direction towards the immersion space between the final element of the projection system PS and the substrate W. In an embodiment the first direction is towards an opening for the extraction of liquid.

Desirably the surface is made to be liquidphilic to the immersion liquid. For example, the immersion liquid may have a static contact angle to the first surface of less than 90°, desirably less than 70', more desirably less than 50° and most desirably less than 30°.

An advantage of having a liquidphilic surface is that a thinner film of liquid will thereby be present on the surface. Additionally a surface-tension drainage force is only imparted if the liquid is on the curved surface as a film, rather than droplets. Ensuring that the surface is liquidphilic means that any liquid on the curved surface is more likely to be in a film (as opposed to droplets) than if a non-liquidphilic surface were used.

The larger the radius of curvature difference from one end of the surface to the other the better as that produces a greater surface-tension drainage force. A suitable minimum radius of curvature of the first surface is less than 1 mm, desirably less than 0.1 mm and most desirably less than 0.01 mm. A mini­mum radius of 1 µm is achievable for the ceramics used to manufacture the substrate table WT. For an optical element (e.g. the final element of the projection system PS) the mini­mum radius may be even less, perhaps 0.1 µm. The maximum radius of curvature for the curved surface is as high as pos­sible. Higher than 1 mm is desirable, more desirably higher than 10 mm and most desirably higher than 100 mm. A suitable length of the first surface selected from the range of 0.05 mm to 20 mm, desirably from the range of 0.05 mm to 2 mm, or most desirably from the range of 0.05 mm and 1 mm. The shorter the length, the higher the surface-tension drain­age force. For water, the curved surface can apply a surface-tension drainage force greater than the force of gravity with a length of up to 3 mm. Above this the surface-tension drainage force is small, but may still be useful. It may be possible to pin the meniscus at the end of the curved first surface if it is concave where the local radius of curvature is least. In some embodiments this may be advantageous because it is then more predictable where the meniscus will be so that any heat load applied to the surface through evaporation is substan­tially constant, at least in terms of the location at which the heat load is applied.

The first surface is curved with a continually changing radius, which increases with displacement along the surface. The displacement may have a vertical and/or horizontal com­ponent.

If there is no evaporation or condensation on the curved surface, but only liquid film flow, the curvature ($\kappa$=1/Radius) of the surface is desirably linearly changing with the length as in the formula: $\kappa$=As+B, where A and B are constants. If there is evaporation or condensation, the curvature ($\kappa$=1/Radius) of the surface is desirably quadratically changing with the length as in the formula: $\kappa$=As$^2$+Bs+C, where A, B and C are constants.

An embodiment of the invention makes use of a curved surface which induces a surface-tension drainage force on a film of liquid on the surface in order to control the position of immersion liquid in an immersion lithographic apparatus.

In FIG. 6 various locations have been indicated at which the first surface of an embodiment of the invention may be beneficial.

Location 210 is an area of the surface of the side of the projection system PS. Location 210 is in the area in which the meniscus 200 of liquid from the immersion space 11 that extends between the liquid confinement structure 12 and the projection system PS contacts the projection system PS.

Movement of the substrate W and/or the substrate table WT under the projection system PS can result in the position of the meniscus 200 on the surface of the projection system PS at location 210 changing. When the position of the meniscus 200 moves towards the immersion space 11, e.g. downwards, a film of liquid can be left on the projection system PS, for example on at least part of the area at the location 210. Such a film of liquid can evaporate, thereby applying a heat load to the projection system PS. Desirably the position of the meniscus 200 on the projection system is constant. However, some movement of the meniscus 200 over the surface of the projection system PS may be inevitable. So, it is desirable for the position of the meniscus on the projection system PS to be stable (i.e. located generally in the same region so that there is as little movement of the meniscus over the surface as possible). In view of failing to have a constant position for the meniscus, it is desirable for any film of liquid left behind on the surface to be drained away, desirably as quickly as possible. Forming a curved surface, which is curved such that a surface-tension drainage force acts in a downwards direction (towards the immersion space 11) at location 210, is thereby advantageous.

The location 210 may be on an inclined surface of the projection system PS which defines the immersion space 11, such as the final element of the projection system PS. The location 210 is at a region of the surface of the projection system at which a meniscus 200, in use, extends from the projection system PS to the liquid confinement structure 12. The location 210 may be at any position along the length of the inclined surface at the edge of the immersion space 11.

Figure 8:
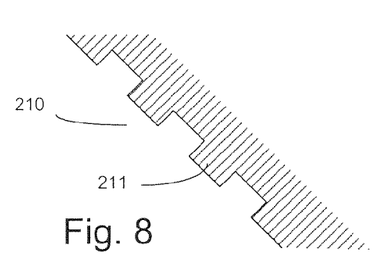
FIG. 8 depicts, in cross-section, a plurality of meniscus pinning features.

U.S. patent application no. U.S. 61/171,704 which was filed on 22 Apr. 2009 (and which is hereby incorporated by reference in its entirety) describes having a plurality of pinning features in the location 210. These can help to limit the height variations in the position of the meniscus 200. An example is shown in FIG. 8 in which a plurality of protrusions 211 exist in the region 210. The pattern formed by the plurality of protrusions may surround the optical path, for example on the inclined surface. The arrangement may be a plurality of recesses 213 formed in the surface at region 210. Recesses 213 may be arranged alternately with the protrusions 211. The plurality of pinning features may be arranged to form a pattern and may be in a uniform or irregular arrangement. They may be arranged in a repeating series over the surface of region 210.

An embodiment of the invention can be applied to a plurality of meniscus pinning features such as illustrated in FIG. 8. This is accomplished by providing at least two curved surfaces which are curved to generate surface-tension drainage forces.

Figure 9:
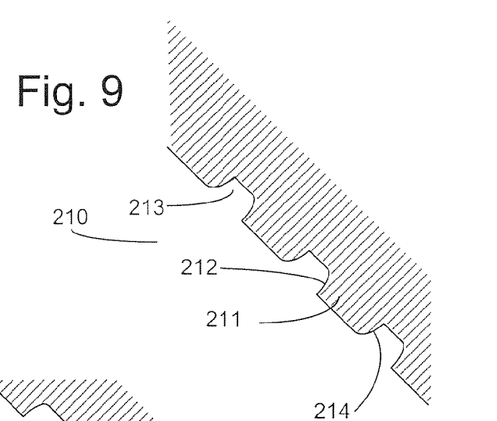
FIG. 9 depicts, in cross-section, a plurality of meniscus pinning features according to an embodiment of the invention.

In the example of FIG. 9, the lower surface 214 of a protrusion 211 is curved to encourage liquid to drain downwards from the recess 213 between protrusions 211 onto the outer face of the protrusion 211. At the upper surface 212 of the protrusion 211 a sharp corner is present thereby encouraging the meniscus to pin at that surface. Surfaces 212 and 214 can be seen as at least in part defining side walls of the recess 213 or of the protrusion 211. Therefore, in FIG. 9 there are both concave and convex curved surfaces. In an embodiment, with respect to a recess 213, a convex surface may be further away from the immersion space 11 than the concave surface (as illustrated), or vice versa. The concave and convex surfaces each forming a side wall of the recess 213.

Figure 10:
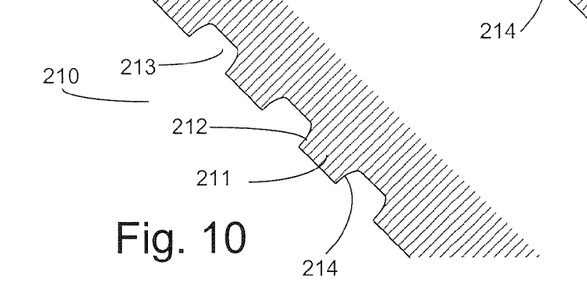
FIG. 10 depicts, in cross-section, a plurality of meniscus pinning features according to an embodiment of the invention.

In the embodiment of FIG. 10 the upper surface 212 of a protrusion 211 is curved in the same way as the embodiment of FIG. 9. However, the lower surface 214 of a protrusion 211 is curved in the opposite direction to the embodiment of FIG. 9. Therefore, each protrusion provides a corner at which the meniscus may be pinned at its upper point and its lower point. In the FIG. 10 embodiment only concave surfaces are used. As with the other embodiments, one or more of the advantages of the curved surface arrangements include: reduced liquid area at which evaporation takes place, defined pinning locations of liquid, therefore reproducible evaporation locations, and collection of liquid at defined places, resulting in a more stable evaporation load over time when the liquid level varies over time. In an embodiment, only convex surfaces are present.

Figure 11:
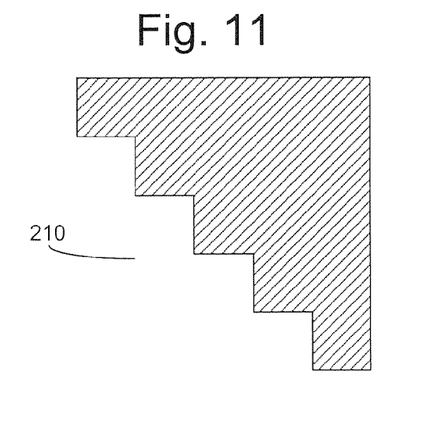
FIG. 11 depicts, in cross-section, a stepped structure.

FIG. 11 illustrates a stepped structure which can be used as a plurality of meniscus pinning features. An embodiment of the invention can be applied to such a stepped structure to form a structure such as that illustrated in FIG. 12. Curved surfaces are placed adjacent to one another thereby to define or form a ridge 215 between them. The radius of curvature at each ridge 215 is small such that a meniscus would be pinned at the ridge 215. If a meniscus of a liquid film is between ridges 215 the curved surface is such that the meniscus has a force applied to it. The applied force has a surface-tension drainage component such that the liquid film, and so the meniscus, moves down towards the next ridge 215.

Figure 12:
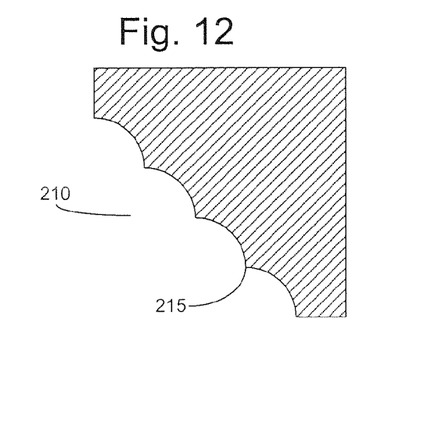
FIG. 12 depicts, in cross-section, a stepped structure according to an embodiment of the invention.

Although FIGS. 9, 10 and 12 illustrate embodiments of a plurality of meniscus pinning features which may be used in area 210, this is not necessarily the case. For example, in one embodiment only a single curved surface which induces a surface-tension drainage force may be present in area 210.

A location at which a curved surface which induces a surface-tension drainage force on a film of liquid may be used is at location 220. Location 220 is at a corner of the projection system PS. The location 220 is a corner between a substantially horizontally surface and a surface at an angle to horizontal. Immersion liquid, should it reach location 220, could become stuck there. Having a curved surface at location 220 which would induce a surface-tension drainage force on that immersion liquid at this location 220 is beneficial.

In an embodiment, there may be a curved surface at location 230 at or adjacent an edge of the inclined surface of the final element of the projection system PS. Immersion liquid may be trapped at an edge and providing a curved surface which induces a surface-tension drainage force on a film of liquid at this location may thereby be beneficial, particularly when fast drainage of liquid off the final element is desired, for example when the apparatus is set to convert to dry mode, so that excessive cooling is avoided and thereby thermal reconditioning takes less time. Additionally or alternatively a convex curve may be provided on the outer edge of the bottom surface (the horizontal surface) of the final element of the projection system PS. This helps prevent the liquid layer from detaching from the final element. As a result this makes higher liquid flow rates in the space 11 possible. The resulting higher liquid refresh rate in the space 11 allows faster restoring of optical properties of the liquid after a disturbance has taken place. A disturbance could be a scan movement of the substrate W so that a surface passes under the space 11 with a deviating temperature or could be as a result of the projection beam heating liquid in the space 11.

There may be other components which have corners or edges similar to location 220 and 230 on the projection system PS. It may be beneficial to provide a curved surface which induces a surface-tension drainage force at corners or edges of components other than the projection system PS. In an embodiment, a curved surface which induces a surface-tension drainage force may be applied at location 240 which is a corner on the top of the liquid confinement structure 12. In an embodiment, location 250 on the liquid confinement structure 12 is an edge at which it may be beneficial to provide a curved surface which induces a surface-tension drainage force.

Location 250 may be at an edge of the liquid confinement structure 12 or may be a region of the surface of the liquid confinement structure 12 closer to the immersion space 11 than the edge. The location 250 may be a region of the surface of the liquid confinement structure 12 at which the meniscus 200 of immersion liquid may be positioned. The surface of the liquid confinement structure 12 at position 250, if it is closer towards the space 11 than the edge, may have similar features to the surface of the projection system PS at position 210. The position 250 in this region may be treated in a similar way to position 210 on the projection system PS, as described above. Additionally or alternatively the position 250 may be treated as an edge in the same way as position 230 on the projection system PS.

Figure 13:
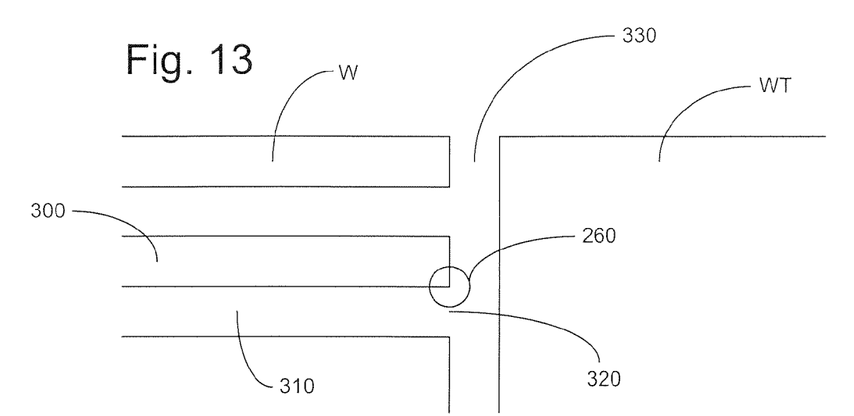
FIG. 13 depicts, in cross-section, an area of a substrate table at the edge of a substrate.
Figure 14:
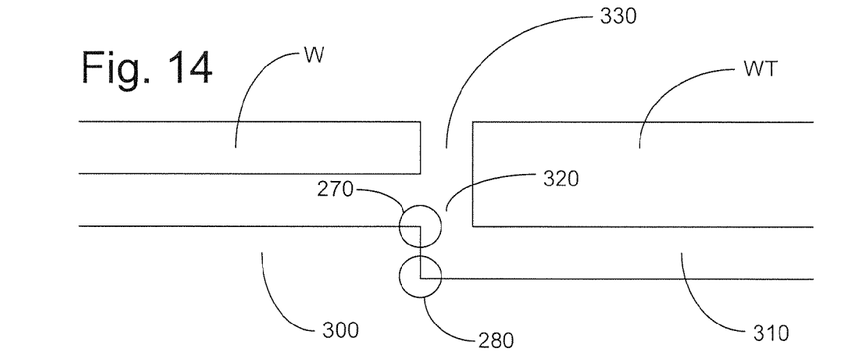
FIG. 14 depicts, in cross-section, an area of a substrate table at the edge of a substrate.

FIGS. 13 and 14 illustrate embodiments in which the curved surface which induces a surface-tension drainage force is part of the surface of a substrate table WT configured to support a substrate W. The substrate table WT may have one or more openings and/or passageways of an outlet for the extraction of immersion liquid therethrough, for example in a gap in the substrate table WT, around the edge of a substrate W when supported by the substrate table WT.

Other components may also have such openings and/or passageways. For example a bridging surface which is used during substrate swap to transfer an immersion space 11 between two tables may have a gap formed in the surface. In an embodiment the surface either side of the gap is formed from the surface of the two tables, which may be a measurement table and a substrate table WT. In an embodiment the bridging surface is a bridge which is positioned between the two tables, such as a first substrate table WT and a second substrate table WT, during substrate swap. The bridge may have a gap formed between the bridging surface and the surfaces of the tables.

The gap may include one or more outlets for the extraction of immersion liquid therethrough. Openings and/or passageways of such outlets may be provided with a curved surface which induces a surface-tension drainage force in the same way. For example, see U.S. patent application Ser. No. 12/472,099 which was filed on 26 May 2009 (which is hereby incorporated by reference in its entirety) discloses details of an outlet for immersion liquid which escapes between a gap which travels underneath an immersion space, for example between two substrate tables and/or a substrate table and a bridge to another substrate table. The curved surface which induces a surface-tension drainage force on a film of liquid on it could be applied to corners illustrated in U.S. patent application Ser. No. 12/472,099, for example. These surfaces may be similar to those described below in relation to FIGS. 13 and 14. The curved surfaces described in relation to these outlets helps in maintaining the outlets clear of liquid. This may be beneficial in promoting consistent flow of fluid (in particular gas) out of the outlets.

FIGS. 13 and 14 illustrate an outlet for the extraction of immersion liquid therethrough. The outlet 320 is designed to extract liquid which leaks between a gap 330 between an edge of the substrate W and the edge of a recess of the substrate table WT in which the substrate W is positioned.

In FIG. 13 an outlet 320 is provided under a substrate support 300 on which the substrate W is supported. The substrate support 300 is part of the substrate table WT. The substrate support 300 may, in one embodiment, be a so called pimple table. The passageway 310 of the outlet 320 is directed under the substrate support 300. At a lower part of an outer edge of the substrate support 300 is formed a curved surface. A surface-tension drainage force is induced on a film of liquid present on the curved surface, by the curved surface. This is illustrated as location 260 in FIG. 13. Therefore, this curved surface is provided at an opening to the outlet 320 and/or in a passageway 310 of the outlet 320. The advantage of this is that liquid may smoothly flow past location 260. The liquid may otherwise stick at the sharp outer lower edge of the substrate support 300 thereby partly or completely blocking the outlet 320. This may impede the smooth flow of fluid through the outlet. An uneven flow rate (i.e. a flow rate which varies with time) through the passageway 310, could result. Unsmooth fluid extraction flow could deleteriously lead to vibration and/or uneven cooling effects. Such uncontrolled phenomena are undesirable in an immersion system. An advantage is that the self draining function of the curved surface reduces or eliminates residual liquid in the passageway 310. This decreases the amount of evaporation at that location. Evaporation at that location is particularly undesirable because it is close to the substrate W and can lead to local cooling. Furthermore, if residual liquid remains in the passageway 310, this can result, on re-wetting, in bubble generation. Therefore, it is best if the liquid confinement structure 12 crosses the substrate W edge when the passageway 310 does not have any liquid in it. The use of the curved surface at location 260 can help in this.

The embodiment of FIG. 14 is for a different arrangement of outlet 320. In the embodiment of FIG. 14 the outlet 320 may extend under the top surface of the substrate table WT. The curved surface may be provided at an opening of the outlet 320. For example, the curved surface may be provided at position 270 at the opening which is formed by a corner of the substrate support 300. Alternatively or additionally the curved surface could be applied in the passageway 310 of the outlet, for example at a corner as illustrated at point 280. The arrangement is desirable as, like the arrangement shown in FIG. 13, smooth flow into the passageway may be facilitated.

Figure 15:
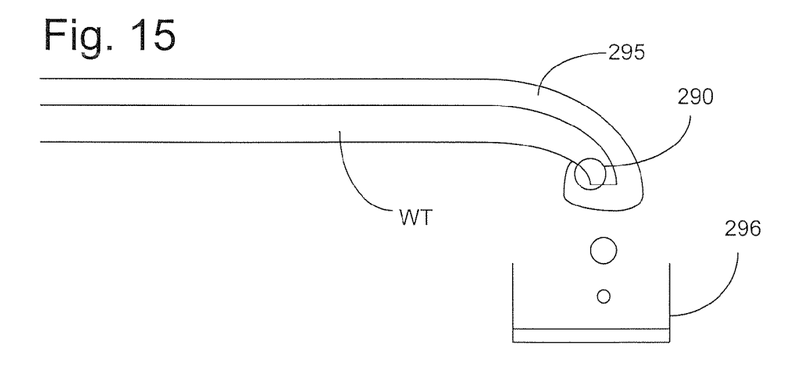
FIG. 15 depicts the edge of a substrate table in an unconfined immersion lithographic apparatus.

As explained above, in an all wet immersion system liquid flows over the edge of the substrate table WT. As described in U.S. patent application no. U.S. 61/176,802 which was filed on 8 May 2009 (which is hereby incorporated by reference in its entirety), the edge of the substrate table WT of an all wet immersion lithographic apparatus may be curved in order to promote desirable flow of immersion liquid over the edge. An undersurface of the edge of the substrate table WT may undesirably be such that immersion liquid attaches to it rather than falling off the edge into a collection drain. Therefore, in one embodiment as illustrated in FIG. 15 a curved surface which induces a surface-tension drainage force on a film of liquid on it may be defined at location 290 on the outer edge of the undersurface of a substrate table WT. Location 290 may be at near the edge of the substrate table WT. In an embodiment, at least a part of location 290 is a part of the undersurface of the substrate table WT and the area of the location 290 may in part be defined by the edge of the substrate table WT. In an embodiment the location 290 may have a surface formed so that it is curved, in the manner as the curved surfaces at locations 220, 230, 270, 280. The surface may have a single curved surface, or a plurality of curved surfaces as described in reference to FIG. 12 herein.

Some of the immersion liquid 295 flowing over the edge of the substrate table WT into drain 296 may collect on the undersurface of the substrate table WT. The curved surface at location 290 may apply an additional force to gravity applied to the immersion liquid on the undersurface so that it moves off the undersurface, for example it may fall off.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated wherein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, there is provided an immersion lithographic apparatus comprising: a curved surface which is curved such that a surface-tension drainage force acts in a direction on a film of immersion liquid on the curved surface.

The surface-tension drainage force may act together with the force of gravity on liquid in the film to move liquid in the film of liquid in the direction. The geometry of the curved surface may be such that the direction is towards an immersion space defined between a projection system and a substrate. The geometry of the curved surface may be such that the direction is towards an opening for the extraction of liquid. The curved surface may be such that immersion liquid has a static contact angle of less than 90° with it, desirably less than 70°, more desirably less than 50° or most desirably less than 30°. The curved surface may be positioned at or adjacent a corner of a component of the immersion lithographic apparatus. The minimum radius of curvature of the curved surface may be less than 1 mm, desirably less than 0.1 mm, or most desirably less than 0.01 mm. The length of the curved surface in the direction may be selected from the range of 0.05 mm to 20 mm, desirably from the range of 0.05 mm to 2 mm, or most desirably from the range of 0.05 mm to 1 mm.

The immersion lithographic apparatus may further comprise an additional surface which is curved and has a decrease in radius of curvature in an additional direction such that a surface-tension drainage force acts in the additional direction on a turn of immersion liquid on the additional surface. The curved surface and the additional surface may be part of a pinning surface comprising a plurality of meniscus pinning features. The curved surface may be concave and the additional surface is convex. The curved and additional surfaces may be next to each other and form a ridge between them. The curved and additional surfaces may define at least in part side walls of a recess.

The curved surface may be on an inclined surface of a final element of the or a projection system. The curved surface may be at a corner between a substantially horizontal surface and a surface at an angle to horizontal of the or a projection system of the immersion lithographic apparatus. The curved surface may be at or adjacent an edge of an inclined surface of a final element of the or a projection system. The curved surface may be on a liquid confinement structure which confines liquid to the or an immersion space between a final element of the or a projection system and a substrate. The curved surface may be at or adjacent an edge of the or an immersion space defined between a final element of the or a projection system and a substrate in which, in use, immersion liquid is provided. The curved surface may be on a substrate table to support a substrate.

The curved surface may at least partly define an opening and/or a passageway of an outlet for the extraction of immersion liquid therethrough. The outlet may be for immersion liquid which passes through a gap between an edge of a substrate and the or a substrate table on which the substrate is supported. The outlet may be an outlet for liquid which passes through a gap between an edge of a substrate table and an edge of a second substrate table or a bridging surface between the first substrate table and a second substrate table.

The immersion apparatus may be an all wet apparatus in which immersion liquid is unconstrained and, in use, substantially covers the top surface of a substrate supported on a substrate table, wherein an undersurface of an edge of the substrate table over which, in use, immersion liquid flows comprises the curved surface. The curved surface may have a local radius of curvature which decreases in a first direction. The curve may be an Adamek curve.

There is provided a liquid confinement structure constructed and arranged to confine liquid to an immersion space between a final element of a projection system and a substrate table and/or a substrate supported by the substrate table. The liquid confinement structure comprises a curved surface which is curved such that a surface-tension drainage force acts in a direction on a film of immersion liquid on the surface.

There is provided a final element of a projection system for an immersion lithographic apparatus. The final element comprises a curved surface which is curved such that a surface-tension drainage force acts in a direction on a film of immersion liquid on the surface. There is provided a substrate table configured to support a substrate in an immersion lithographic apparatus. The substrate table comprises a curved surface which is curved such that a surface-tension drainage force acts in a direction on a film of immersion liquid on the surface.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a projection system configured to project a radiation beam onto a substrate;
   a liquid supply system configured to provide an immersion liquid to a space between the projection system and a table; and
   a curved surface of a solid component of the apparatus, the curved surface having a varying local radius of curvature in a direction such that a surface-tension drainage force acts in the direction on a film of immersion liquid on the curved surface.

2. The immersion lithographic apparatus of claim 1, wherein the surface-tension drainage force acts together with the force of gravity on liquid in the film to move liquid in the film of liquid in the direction.

3. The immersion lithographic apparatus of claim 1, wherein the topography of the curved surface is such that the direction is towards the space.

4. The immersion lithographic apparatus of claim 1, wherein the topography of the curved surface is such that the direction is towards an opening for the extraction of liquid.

5. The immersion lithographic apparatus of claim 1, wherein the curved surface is such that immersion liquid has a static contact angle of less than 90° with it.

6. The immersion lithographic apparatus of claim 5, wherein the static contact angle is less than 70°.

7. The immersion lithographic apparatus of claim 6, wherein the static contact angle is less than 50°.

8. The immersion lithographic apparatus of claim 7, wherein the static contact angle is less than 30°.

9. The immersion lithographic apparatus of any of claim 1, wherein the curved surface is positioned at or adjacent a corner of the component of the immersion lithographic apparatus.

10. The immersion lithographic apparatus of claim 1, further comprising an additional surface which is curved and has a decrease in radius of curvature in an additional direction such that a surface-tension drainage force acts in the additional direction on a film of immersion liquid on the additional surface.

11. The immersion lithographic apparatus of claim 10, wherein the curved surface and the additional surface are part of a pinning surface comprising a plurality of meniscus pinning features.

12. The immersion lithographic apparatus of claim 11, wherein the curved surface is concave and the additional surface is convex.

13. The immersion lithographic apparatus of claim 11, wherein the curved and additional surfaces are next to each other and form a ridge between them.

14. The immersion lithographic apparatus of claim 1, wherein the curved surface is on an inclined surface of a final element of the projection system.

15. The immersion lithographic apparatus of claim 1, wherein the curved surface is at a corner between a substantially horizontal surface and a surface at an angle to horizontal of the projection system of the immersion lithographic apparatus.

16. The immersion lithographic apparatus of claim 1, wherein the curved surface is at or adjacent an edge of an inclined surface of a final element of the projection system.

17. The immersion lithographic apparatus of claim 1, wherein the curved surface is on a liquid confinement structure which confines liquid to the space.

18. The immersion lithographic apparatus of claim 1, wherein the curved surface is at or adjacent an edge of the space.

19. The immersion lithographic apparatus of claim 1, wherein the curved surface has a local radius of curvature which decreases in a first direction.

20. The immersion lithographic apparatus of claim 1, wherein the curve is an Adamek curve.

21. An immersion lithographic apparatus comprising:
    a projection system configured to project a radiation beam onto a substrate; and
    a liquid confinement structure constructed and arranged to confine liquid to an immersion space between a final element of the projection system and a substrate table and/or a substrate supported by the substrate table, the liquid confinement structure comprising a curved surface having a varying local radius of curvature in a direction such that a surface-tension drainage force acts in the direction on a film of immersion liquid on the curved surface.

22. An immersion lithographic apparatus comprising:
    a projection system having a final element; and
    a liquid supply system configured to provide an immersion liquid to contact the final element,
    wherein the final element comprises a curved surface having a varying local radius of curvature in a direction such that a surface-tension drainage force acts in the direction on a film of immersion liquid on the curved surface.

23. An immersion lithographic apparatus comprising:
a projection system configured to project a radiation beam onto a substrate;
a liquid supply system configured to provide an immersion liquid to contact an exterior surface of the projection system; and
a substrate table configured to support the substrate, the substrate table comprising a curved surface having a varying local radius of curvature in a direction such that a surface-tension drainage force acts in the direction on a film of immersion liquid on the curved surface.

* * * * *